United States Patent
Kim et al.

(10) Patent No.: US 11,170,824 B2
(45) Date of Patent: Nov. 9, 2021

(54) ELECTRONIC DEVICE

(71) Applicant: SK hynix Inc., Icheon (KR)

(72) Inventors: Myoung-Sub Kim, Icheon (KR);
Tae-Hoon Kim, Icheon (KR);
Hye-Jung Choi, Icheon (KR);
Seok-Man Hong, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 17/088,334

(22) Filed: Nov. 3, 2020

(65) Prior Publication Data

US 2021/0050036 A1  Feb. 18, 2021

Related U.S. Application Data

(63) Continuation of application No. 16/698,802, filed on Nov. 27, 2019, now Pat. No. 10,861,503.

(30) Foreign Application Priority Data

Jun. 27, 2019  (KR) .......................... 10-2019-0077102

(51) Int. Cl.
| | |
|---|---|
| *G11C 5/02* | (2006.01) |
| *H01L 27/22* | (2006.01) |
| *G11C 13/00* | (2006.01) |
| *H01L 27/108* | (2006.01) |

(52) U.S. Cl.
CPC ............ *G11C 5/025* (2013.01); *G11C 13/004* (2013.01); *H01L 27/228* (2013.01); *H01L 27/10808* (2013.01)

(58) Field of Classification Search
None
See application file for complete search history.

(56) References Cited

U.S. PATENT DOCUMENTS

2009/0268506 A1* 10/2009 Seigler ................... G11C 11/16
365/148

FOREIGN PATENT DOCUMENTS

KR   20170109014 A   9/2017

OTHER PUBLICATIONS

Kim et al., "High-performance, cost-effective 2z nm two-deck cross-point memory integrated by self-align scheme for 128 Gb SCM," IEEE, 2018, pp. 37.1.1-37.1.4.

* cited by examiner

*Primary Examiner* — James G Norman

(57) ABSTRACT

A semiconductor memory includes: a first line; a second line spaced apart from the first line and extending in a first direction; a third line spaced apart from the second line and extending in a second direction; a first memory cell disposed between the first and second lines at an intersection region of the first and second lines, the first memory cell including a first selection element layer, a first electrode, and a first insert electrode interposed between the first selection element layer and the first electrode; and a second memory cell disposed between the second and third lines at an intersection region of the second and third lines, the second memory cell including a second selection element layer, a second electrode, and a second insert electrode interposed between the second selection element layer and the second electrode.

14 Claims, 12 Drawing Sheets

ELECTRONIC DEVICE

CROSS-REFERENCE TO RELATED APPLICATION

The present application is a continuation of U.S. patent application Ser. No. 16/698,802, filed Nov. 27, 2019, which claims priority to Korean Patent Application No. 10-2019-0077102, filed on Jun. 27, 2019, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a switching characteristic between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes various implementations of an electronic device which has improved operation characteristics.

In an implementation, an electronic device includes a semiconductor memory, which includes: a first line; a second line spaced apart from the first line, the second line extending in a first direction that crosses the first line; a third line spaced apart from the second line, the third line extending in a second direction that crosses the second line; a first memory cell disposed between the first line and the second line at an intersection region of the first line and the second line, the first memory cell including a first selection element layer and a first electrode coupled to the first selection element layer; and a second memory cell disposed between the second line and the third line at an intersection region of the second line and third second line, the second memory cell including a second selection element layer and a second electrode coupled to the second selection element layer, wherein a threshold voltage of the first selection element layer is greater than a threshold voltage of the second selection element layer, and a resistance of the second electrode is greater than a resistance of the first electrode.

In another implementation, an electronic device includes a semiconductor memory, which includes: a first line; a second line spaced apart from the first line and extending in a first direction that crosses the first line; a third line spaced apart from the second line and extending in a second direction that crosses the second line; a first memory cell disposed between the first line and the second line at an intersection region of the first line and the second line, the first memory cell including a first selection element layer, a first electrode coupled to the first selection element layer, and a first insert electrode interposed between the first selection element layer and the first electrode; and a second memory cell disposed between the second line and the third line at an intersection region of the second line and third second line, the second memory cell including a second selection element layer, a second electrode coupled to the second selection element layer, and a second insert electrode interposed between the second selection element layer and the second electrode, wherein a threshold voltage of the first selection element layer is greater than a threshold voltage of the second selection element layer, and a resistance of the second insert electrode is greater than a resistance of the first insert electrode.

These and other aspects, implementations and associated advantages are described in greater detail in the drawings, the description and the claims.

DETAILED DESCRIPTION

Figure 1A:
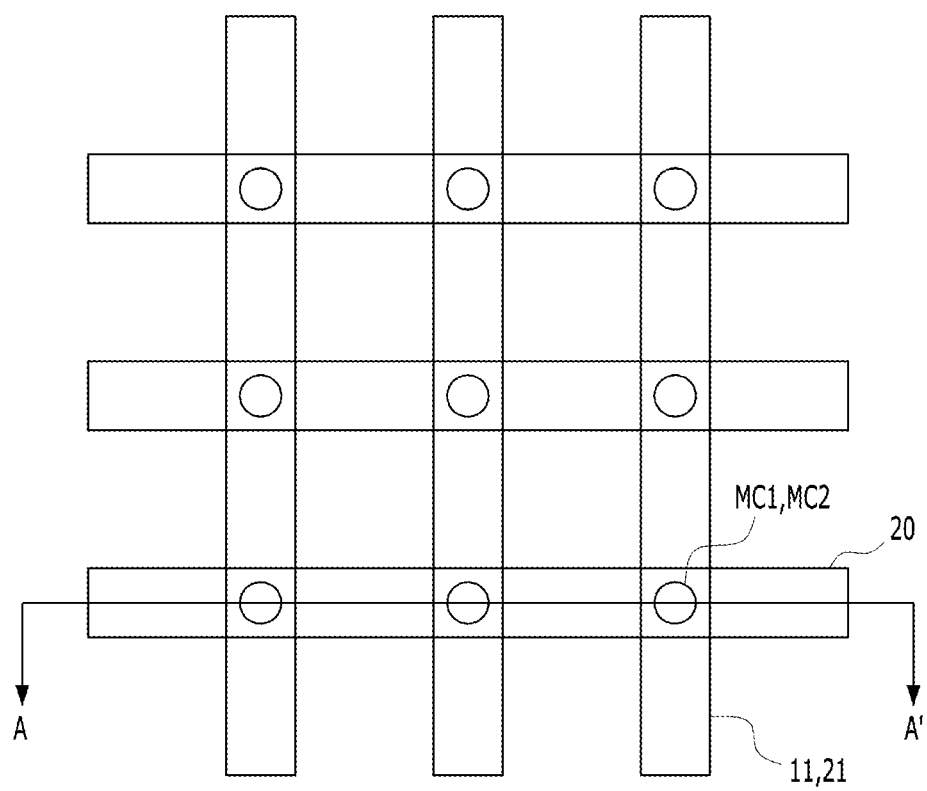
FIGS. 1A and 1B are views illustrating a semiconductor memory according to an implementation of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible.

In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
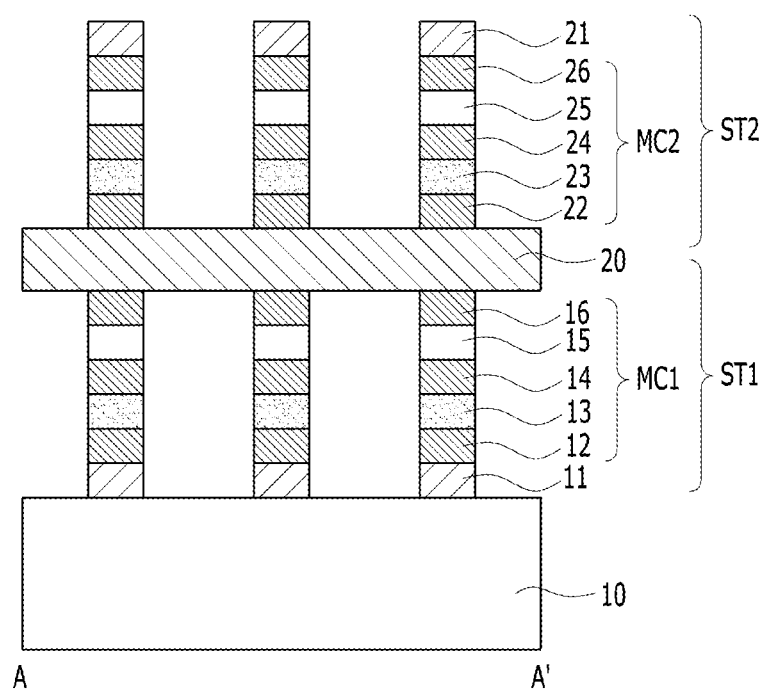

FIGS. 1A and 1B are views illustrating a semiconductor memory according to an implementation of the present disclosure. FIG. 1A shows a planar view, and FIG. 1B shows a cross-sectional view taken along a line A-A' of FIG. 1A.

Referring to FIGS. 1A and 1B, the semiconductor memory according to the present implementation may include a substrate 10, first lines 11 formed over the substrate 10 and each extending in a first direction crossing the line A-A', second lines 20 formed over the first lines 11 to be spaced apart from the first lines 11 and each extending in a second direction parallel to the line A-A', third lines 21 formed over the second lines 20 to be spaced apart from the second lines 20 and each extending in the first direction to substantially overlap with the first lines 11 in a planar view, first memory cells MC1 disposed between the first lines 11 and the second lines 20 at intersection regions of the first lines 11 and the second lines 20, and second memory cells MC2 disposed between the second lines 20 and the third lines 21 at intersection regions of the second lines 20 and the third lines 21.

The first memory cell MC1 may include a first lower electrode layer 12, a first selection element layer 13, a first middle electrode layer 14, a first memory layer 15, and a first upper electrode layer 16 which are sequentially stacked. The first lower electrode layer 12 may be located at a lowermost portion of the first memory cell MC1 and function as a transfer path of a voltage or current supplied from the first line 11. The first selection element layer 13 may control an access to the first memory layer 15. The first middle electrode layer 14 may physically separate the first selection element layer 13 and the first memory layer 15 from each other while electrically coupling them with each other. The first memory layer 15 may store different data. For example, the first memory layer 15 may have a variable resistance characteristic which switches between different resistance states according to a voltage or current applied thereto. The first upper electrode layer 16 may be located at an uppermost portion of the first memory cell MC1 and function as a transfer path of a voltage or current supplied from the second line 20.

Similarly, the second memory cell MC2 may include a second lower electrode layer 22, a second selection element layer 23, a second middle electrode layer 24, a second memory layer 25, and a second upper electrode layer 26 which are sequentially stacked. The second lower electrode layer 22 may be located at a lowermost portion of the second memory cell MC2 and function as a transfer path of a voltage or current supplied from the second line 20. The second selection element layer 23 may control an access to the second memory layer 25. The second middle electrode layer 24 may physically separate the second selection element layer 23 and the second memory layer 25 from each other while electrically coupling them with each other. The second memory layer 25 may store different data. For example, the second memory layer 25 may have a variable resistance characteristic which switches between different resistance states according to a voltage or current applied thereto. The second upper electrode layer 26 may be located at an uppermost portion of the second memory cell MC2 and function as a transfer path of a voltage or current supplied from the third line 21.

The first lower electrode layer 12, the first selection element layer 13, the first middle electrode layer 14, the first memory layer 15, and the first upper electrode layer 16 may be formed of substantially the same materials and have substantially the same shapes as the second lower electrode layer 22, the second selection element layer 23, the second middle electrode layer 24, the second memory layer 25 and the second upper electrode layer 26, respectively. That is, the first memory cell MC1 and the second memory cell MC2 may have substantially the same structure.

The first lines 11, the second lines 20, and the first memory cells MC1 between them may be referred to as a first stack structure ST1, whereas the second lines 20, the third lines 21, and the second memory cells MC2 between them may be referred to as a second stack structure ST2. The first stack structure ST1 and the second stack structure ST2 may share the second lines 20. Therefore, when the first lines 11 and the third lines 21 function as word lines, the second lines 20 may function as common bit lines. Alternatively, when the first lines 11 and the third lines 21 function as bit lines, the second lines 20 may function as common word lines.

However, in the above-described semiconductor memory, since the first stack structure ST1 and the second stack structure ST2 share the second lines 20, a polarity of a voltage applied to the first memory cell MC1 may be opposite to a polarity of a voltage applied to the second memory cell MC2, or a direction of a current flowing through the first memory cell MC1 may be opposite to a direction of a current flowing through the second memory cell MC2, or both. As an example, when a given positive voltage is applied to the second line 20 and a given negative voltage is applied to the first and third lines 11 and 21 for a specific operation, a direction of a current flowing through the first memory cell MC1 is a direction from the top to the bottom of the first memory cell MC1 in FIG. 1B while a direction of a current flowing through the second memory cell MC2 is a direction from the bottom to the top of the second memory cell MC2 in FIG. 1B. In this example, although the first memory cell MC1 and the second memory cell MC2 have substantially the same structure, characteristics of the first memory cell MC1 and the second memory cell MC2 may be different during operations of the semiconductor memory. In particular, during a write operation in which a resistance state of the first memory cell MC1 or the second memory cell MC2 is changed between a low resistance state and a high resistance state, a threshold voltage of the first memory cell MC1 and a threshold voltage of the second memory cell MC2 may become different from each other.

In the following implementations, a semiconductor memory device capable of reducing these different characteristics (e.g., a difference in threshold voltages) of memory cells in respective stack structures will be described.

Figure 2A:
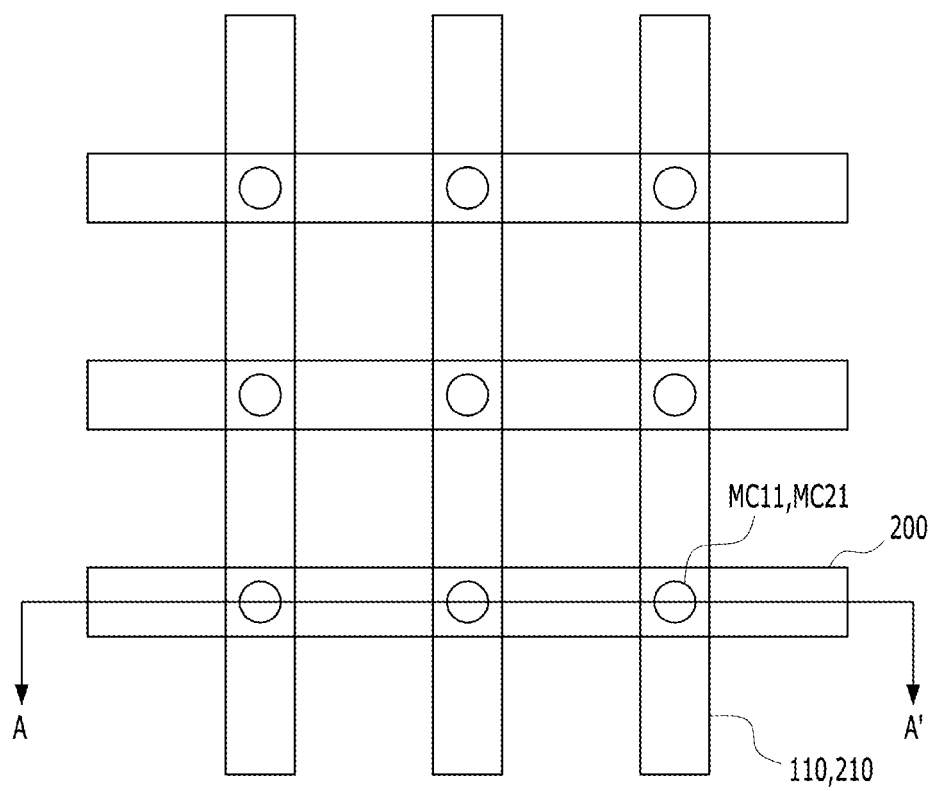
FIGS. 2A and 2B are views illustrating a semiconductor memory according to an implementation of the present disclosure.
Figure 2B:
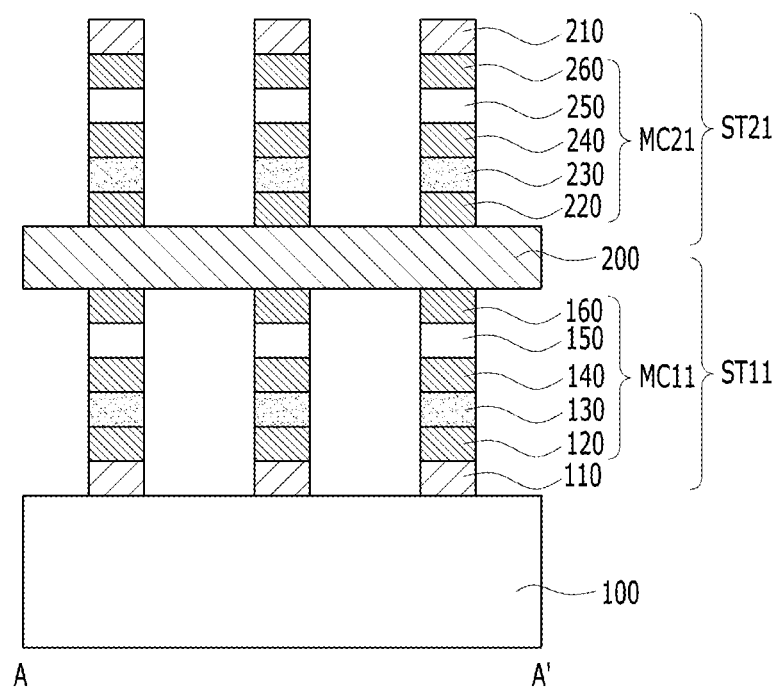

FIGS. 2A and 2B are views illustrating a semiconductor memory according to an implementation of the present disclosure. FIG. 2A shows a planar view, and FIG. 2B shows a cross-sectional view taken along a line A-A' of FIG. 2A.

Referring to FIGS. 2A and 2B, the semiconductor memory according to the present implementation may include a substrate 100, first lines 110 formed over the substrate 100 and each extending in a first direction crossing the line A-A', second lines 200 formed over the first lines 110 to be spaced apart from the first lines 110 and each extending in a second direction parallel to the line A-A', third lines 210 formed over the second lines 200 to be spaced apart from the second lines 200 and each extending in the first direction to substantially overlap with the first lines 110 in a planar view, first memory cells MC11 disposed between the first lines 110 and the second lines 200 at intersection regions of the first lines 110 and the second lines 200, and second memory cells MC21 disposed between the second lines 200 and the third lines 210 at intersection regions of the second lines 200 and the third lines 210.

In a planar view, the first memory cell MC11 and the second memory cell MC21 may have a circular shape. However, a planar shape of the first memory cell MC11 and the second memory cell MC21 may vary according to embodiments. For example, each of the first memory cell MC11 and the second memory cell MC21 may have a rectangular shape and both sidewalls of each of the first memory cell MC11 and the second memory cell MC21 in the first direction may be aligned with the first line 110 or the third line 210, and both sidewalls of each of the first memory cell MC11 and the second memory cell MC21 in the second direction may be aligned with the second line 200.

The first lines 110, the second lines 200, and the first memory cells MC11 between them may be referred to as a first stack structure ST11, whereas the second lines 200, the third lines 210, and the second memory cells MC21 between them may be referred to as a second stack structure ST21. The first stack structure ST11 and the second stack structure ST21 may share the second lines 200. Therefore, when the first lines 110 and the third lines 210 function as word lines, the second lines 200 may function as common bit lines. Alternatively, when the first lines 110 and the third lines 210 function as bit lines, the second lines 200 may function as common word lines. One or more of a space between the first lines 110, a space between the first memory cells MC11, a space between the second lines 200, a space between the second memory cells MC21, and a space between the third lines 210 may be filled with an insulating material (not shown).

The substrate 100 may include a lower structure (not shown). For example, the substrate 100 may include a transistor (not shown) coupled to one or more of the first lines 110, the second lines 200, and the third lines 210 and controlling them.

The first line 100, the second line 200, and the third line 210 may have a single-layered structure or a multi-layered structure including various conductive materials such as a metal, a metal nitride, or a combination thereof. In this implementation shown in FIGS. 2A and 2B, the first lines 110 substantially entirely overlap with the third lines 210, respectively, in a planar view. However, in another implementation, the first lines 110 may not entirely overlap with the third lines 210. For example, an extending direction of each of the third lines 210, which crosses the second lines 200, may be different from an extending direction of each of the first lines 110.

The first memory cell MC11 may include a first lower electrode layer 120, a first selection element layer 130, a first middle electrode layer 140, a first memory layer 150, and a first upper electrode layer 160 which are sequentially stacked. However, a structure of the first memory cell MC11 may vary according to embodiments. As an example, positions of the first selection element layer 130 and the first memory layer 150 may be reversed with each other. That is, the first memory layer 150 may be disposed closer to the first line 110 than the first selection element layer 130 and the first selection element layer 130 may be disposed closer to the second line 200 than the first memory layer 150. Alternatively, as an example, the first memory cell MC11 may further include one or more layers for improving characteristics of the first memory cell MC1, in addition to the layers 120 to 160. Alternatively, as an example, one or more of the first lower electrode layer 120, the first middle electrode layer 140, and the first upper electrode layer 160 may be omitted. However, one or both of the first middle electrode layer 140 and the first lower electrode layer 120, which are located over and under the first selection element layer 130, respectively, may exist according to implementations of the present disclosure.

The first lower electrode layer 120 may be located at a lowermost portion of the first memory cell MC11 and function as a transfer path of a voltage or current supplied from the first line 110. The first selection element layer 130 may control an access to the first memory layer 150. The first middle electrode layer 140 may physically separate the first selection element layer 130 and the first memory layer 150 from each other while electrically coupling them with each other. The first memory layer 150 may store different data. The first upper electrode layer 160 may be located at an uppermost portion of the first memory cell MC11 and function as a transfer path of a voltage or current supplied from the second line 200.

Similarly, the second memory cell MC21 may include a second lower electrode layer 220, a second selection element layer 230, a second middle electrode layer 240, a second memory layer 250, and a second upper electrode layer 260 which are sequentially stacked. However, a structure of the second memory cell MC21 may vary according to embodiments. As an example, positions of the second selection element layer 230 and the second memory layer 250 may be reversed with each other. Alternatively, as an example, the second memory cell MC21 may further include one or more layers for improving characteristics of the second memory cell MC21, in addition to the layers 220 to 260. Alternatively, as an example, one or more of the second lower electrode layer 220, the second middle electrode layer 240, and the second upper electrode layer 260 may be omitted. However, one or both of the second middle electrode layer 240 and the second lower electrode layer 220, which are located over and under the second selection element layer 230, respectively, may exist according to implementations of the present disclosure.

The second lower electrode layer 220 may be located at a lowermost portion of the second memory cell MC21 and function as a transfer path of a voltage or current supplied from the second line 200. The second selection element layer 230 may control an access to the second memory layer 250. The second middle electrode layer 240 may physically separate the second selection element layer 230 and the second memory layer 250 from each other while electrically coupling them with each other. The second memory layer 250 may store different data. The second upper electrode layer 260 may be located at an uppermost portion of the second memory cell MC21 and function as a transfer path of a voltage or current supplied from the third line 210.

The first memory cell MC11 and the second memory cell MC21 may be substantially identical to each other, except that resistances of the first and second lower electrode layers 120 and 220, or resistances of the first and second middle electrode layers 140 and 240, or both may differ. That is, types and a stacking order of layers constituting the first memory cell MC11 may be the same as types and a stacking order of layers constituting the second memory cell MC21. Also, a layer of the first memory cell MC11 and a layer of the second memory cell MC21, which corresponds to the layer of the first memory cell MC11, may include the same material and have substantially the same shape, thickness, and the like. For example, the first selection element layer 130 and the second selection element layer 230 may formed at positions corresponding to each other, that is, each being a second element from the bottom of a corresponding one of the first memory cell MC11 and the second memory cell MC21. Also, the first selection element layer 130 and the second selection element layer 230 may include the same material, and have substantially the same shape and thickness. Also, for example, the first memory layer 150 and the second memory layer 250 may formed at positions corresponding to each other, that is, each being a second element from the top of a corresponding one of the first memory cell MC11 and the second memory cell MC21. Also, the first memory layer 150 and the second memory layer 250 may include the same material, and have substantially the same shape and thickness.

The first and second selection element layers 130 and 230 may each have a selection element characteristic in order to perform the aforementioned access function. That is, the first and second selection element layers 130 and 230 may each substantially block a current flow when a level of an applied voltage or current is equal to or lower than a given threshold value, and pass a current that sharply increases substantially proportionally to a magnitude of the applied voltage or current when the level of the applied voltage or current is higher than the given threshold value. As for the first and second selection element layers 130 and 230, a Metal-Insulator-Transition (MIT) device such as $NbO_2$ or $TiO_2$, a Mixed Ion-Electron Conducting (MIEC) device such as $ZrO_2(Y_2O_3)$, $Bi_2O_3$—BaO, or $(La_2O_3)x(CeO_2)1-x$, an Ovonic Threshold Switching (OTS) device including a chalcogenide-based material such as $Ge_2Sb_2Te_5$, $As_2Te_3$, $As_2$ or $As_2Se_3$, or a tunneling insulating layer that is formed of a thin film including various insulating materials, e.g., a silicon oxide, a silicon nitride, a metal oxide and so forth, and allows tunneling of electrons under a condition of a given voltage or current may be used. The first and second selection element layers 130 and 230 may have a single-layered structure, or a multi-layered structure that shows the selection element characteristic with a combination of two or more layers.

The first and second memory layers 150 and 250 may each store different data in various manners. For example, the first and second memory layers 150 and 250 may each include a variable resistance layer which switches between different resistances states according to an applied voltage or current. The variable resistance layer may include a material used in an RRAM, a PRAM, an FRAM, or an MRAM, for example, a metal oxide such as a transition metal oxide or a perovskite-based material, a phase-change material such as a chalcogenide-based material, a ferroelectric material, a ferromagnetic material, or the like. The variable resistance layer may have a single-layered structure, or a multi-layered structure that shows a variable resistance characteristic with a combination of more than two layers. For example, the variable resistance layer may include a phase change material which switches between an amorphous state and a crystalline state by Joule's heat generated according to a current flowing through the variable resistance layer. When the phase change material is in the amorphous state, the phase change material may be in a relatively high resistance state, and when the phase change material is in the crystalline state, the phase change material may be in a relatively low resistance state. Data may be stored using the different resistance states of the phase change material.

The first and second lower electrode layers 120 and 220, the first and second middle electrode layers 140 and 240, and the first and second upper electrode layers 160 and 260 may each have a single-layered structure or a multi-layered structure including various conductive materials such as a metal, a metal nitride, a carbon, or the like.

In the above-described semiconductor memory, since the first stack structure ST11 and the second stacked structure ST21 share the second lines 200, a direction of a current flowing through the first memory cell MC11 may be different from a direction of a current flowing through the second memory cell MC21. As an example, when a given positive voltage is applied to the second line 200 and a given negative voltage is applied to the first and third lines 110 and 210 for a specific operation, for example, a write operation or a read operation, currents may flow from the second line 200 toward the first and third lines 110 and 210. In an embodiment, each of the given positive voltage and negative voltage is predetermined based on the specific operation to be performed. Therefore, the direction of the current flowing through the first memory cell MC11 may be a direction from the top to the bottom of the first memory cell MC11 in FIG. 2B, while the direction of the current flowing through the second memory cell MC21 may be a direction from the bottom to the top of the second memory cell MC21 in FIG. 2B. Conversely, although not shown, when a given negative voltage is applied to the second line 200 and a given positive voltage is applied to the first and third lines 110 and 210, currents may flow from the first and third lines 110 and 210 toward the second line 200. Therefore, the direction of the current flowing through the first memory cell MC11 may be a direction from the bottom to the top of the first memory cell MC11, while the direction of the current flowing through the second memory cell MC21 may be a direction from the top to the bottom of the second memory cell MC21.

However, when the direction of the current flowing through the first memory cell MC11 is opposite to the direction of the current flowing through the second memory cell MC21, threshold voltages of the first selection element layer 130 and the second selection element layer 230 may be different from each other. As an example, when the first and second selection element layers 130 and 230 are OTS devices each including a chalcogenide-based material, elements of the first and second selection element layers 130 and 230 may move in different directions according to polarities of voltages applied thereto. For example, when the first and second selection element layers 130 and 230 include Ge, Sb, and Te, Ge and Sb ions may move in a negative pole direction and Te ions may move in a positive pole direction. Therefore, when a given positive voltage is applied to the second line 200 and a given negative voltage is applied to the first and third lines 110 and 210 for the write operation of the first and second memory cells MC11 and MC21, Ge and Sb ions in the first selection element layer 130 move in a direction toward the first line 110 and Te ions in the first selection element layer 130 moves in a direction toward the second line 200, while Ge and Sb ions in the second selection element layer 230 move in a direction toward the third line 210 and Te ions in the second selection element layer 230 moves in a direction toward the second line 200. In this case, in a height direction, a relative distribution of the elements in the first selection element layer 130 may be opposite to a relative distribution of the elements in the second selection element layer 230, so the threshold voltage of the first selection element layer 130 may be greater than the threshold voltage of the second selection element layer 230. However, on the contrary, when the first and second selection element layers 130 and 230 include Ge, Sb, and Te, a negative voltage is applied to the second line 200, and a positive voltage is applied to the first and third lines 110 and 210, the threshold voltage of the second selection element layer 230 may be greater than the threshold voltage of the first selection element layer 130. In addition, the threshold voltages of the first selection element layer 130 and the second selection element layer 230 may be different due to various causes.

If the first memory cell MC11 and the second memory cell MC21 have substantially the same structure, the difference between the threshold voltages of the first selection element layer 130 and the second selection element layer 230 may be reflected in the first memory cell MC11 and the second memory cell MC21. That is, threshold voltages of the first memory cell MC11 and the second memory cell MC21 may be different from each other. For example, when the threshold voltage of the first selection element layer 130 is greater than that of the second selection element layer 230, the threshold voltage of the first memory cell MC11 may be greater than that of the second memory cell MC21. Accordingly, operating characteristics of the first memory cell MC11 and the second memory cell MC21 may be different from each other. In an implementation, in order to compensate for the difference between the threshold voltages of the first selection element layer 130 and the second selection element layer 230, a resistance of the first lower electrode layer 120 may be different from that of the second lower electrode layer 220, or a resistance of the first middle electrode layer 140 may be different from a resistance of the second middle electrode layer 240, or both.

Specifically, if the threshold voltage of the first selection element layer 130 is greater than the threshold voltage of the second selection element layer 230, one or more resistances of the first lower electrode layer 120, the first middle electrode layer 140, the second lower electrode layer 220, and the second middle electrode layer 240 may be adjusted as described in the following cases.

In a first case, the resistance of the second lower electrode layer 220 may be greater than the resistance of the first lower electrode layer 120. In this case, since a contact resistance between the second selection element layer 230 and the second lower electrode layer 220 is increased, an additional offset voltage may be added to the relatively low threshold voltage of the second selection element layer 230. As a result, the threshold voltage of the second memory cell MC21 may increase, and thus the difference between the threshold voltage of the second memory cell MC21 and the threshold voltage with the first memory cell MC11 may decrease. Here, the first and second middle electrode layers 140 and 240 may be omitted or may have substantially the same resistance. For example, a difference between the resistance value of the first middle electrode layer 140 and that of the second middle electrode layer 240 may be equal to or less than 5%, 3%, 1%, 0.5%, 0.3%, or 0.1% of an average value of the resistance values of the first and second middle electrode layers 140 and 240.

Alternatively, in a second case, the resistance of the second middle electrode layer 240 may be greater than the resistance of the first middle electrode layer 140. In this case, since a contact resistance between the second selection element layer 230 and the second middle electrode layer 240 is increased, an additional offset voltage may be added to the relatively low threshold voltage of the second selection element layer 230. As a result, the threshold voltage of the second memory cell MC21 may increase, and thus the difference between the threshold voltage of the second memory cell MC21 and the threshold voltage of the first memory cell MC11 may decrease. Here, the first and second lower electrode layers 120 and 220 may be omitted or may have substantially the same resistance.

Alternatively, in a third case, the resistance of the second lower electrode layer 220 may be greater than the resistance of the first lower electrode layer 120, and the resistance of the second middle electrode layer 240 may be greater than the resistance of the first middle electrode layer 140.

Conversely, if the threshold voltage of the first selection element layer 130 is smaller than the threshold voltage of the second selection element layer 230, one or more resistances of the first lower electrode layer 120, the first middle electrode layer 140, the second lower electrode layer 220, and the second middle electrode layer 240 may be adjusted as described in the following cases.

In a first case, the resistance of the second lower electrode layer 220 may be smaller than the resistance of the first lower electrode layer 120. Here, the first and second middle electrode layers 140 and 240 may be omitted or may have substantially the same resistance.

Alternatively, in a second case, the resistance of the second middle electrode layer 240 may be smaller than the resistance of the first middle electrode layer 140. Here, the first and second lower electrode layers 120 and 220 may be omitted or may have substantially the same resistance.

Alternatively, in a third case, the resistance of the second lower electrode layer 220 may be smaller than the resistance of the first lower electrode layer 120, and the resistance of the second middle electrode layer 240 may be smaller than the resistance of the first middle electrode layer 140.

Meanwhile, one or more resistances of the first lower electrode layer 120, the second lower electrode layer 220, the first middle electrode layer 140, and the second middle electrode layer 240 may be changed in various manners. Hereinafter, for convenience of description, a method of making the resistance of the first lower electrode layer 120 different from that of the second lower electrode layer 220 will be described. However, embodiments of the present disclosure are not limited thereto, and the resistance of the first middle electrode layer 140 can be made different from that of the second middle electrode layer 240 using substantially the same method.

First, types of materials forming the first lower electrode layer 120 and the second lower electrode layer 220 may be different from each other.

As an example, when the first and second lower electrode layers 120 and 220 may include carbon, TiAlN, TiSiN, TaN, Ta, WN, TiN, Ti, W, Al, or Cu, the values of electrical resistance of these materials may be as follows:

carbon>TiAlN>TiSiN>TaN>Ta>WN>TiN>Ti>W>Al>Cu.

Therefore, by considering the electrical resistance of the above materials, specific materials used for the first and second lower electrode layers 120 and 220 may be determined. For example, when the electrical resistance of the first lower electrode layer 120 is smaller than the electrical resistance of the second lower electrode layer 220, TiN may be used as the first lower electrode layer 120 and carbon may be used as the second lower electrode layer 220. In other examples, various combinations of the materials used for the first and second lower electrode layers 120 and 220 may be possible.

As another example, the resistance may be adjusted by doping of an element into the first lower electrode layer 120, or the second lower electrode layer 220, or both, while the same material is used for the first and second lower electrode layers 120 and 220 or different materials are used for the first lower electrode layer 120 and the second lower electrode layer 220. This is because the resistance may vary depending on a type or amount of the doped element. For example, carbon, TiAlN, TiAlN, TiSiN, TaN, Ta, WN, TiN, Ti, W, Al, or Cu may be used for the first lower electrode layer 120 and the second lower electrode layer 220, and O, N, B, As, P, C, Si, or Ge may be doped into one or both of the first and second lower electrode layers 120 and 220. If the first and second lower electrode layers 120 and 220 include the same material, for example, carbon, any one of the first and second lower electrode layers 120 and 220 may be doped with an element (e.g., N) that increases resistance of the doped layer 120 or 220. Alternatively, both of the first and second lower electrode layers 120 and 220 may be doped with different types of elements, which increase respective resistances of the doped layers 120 and 220 to different degrees. Alternatively, the first and second lower electrode layers 120 and 220 may be doped with different concentrations and the same type of element, which increases respective resistances of the doped layers 120 and 220 to different degrees.

Next, while using the same material for the first lower electrode layer 120 and the second lower electrode layer 220, the resistances of the first lower electrode layer 120 and the second lower electrode layer 220 may be different from each other by changing composition of the material.

As an example, although a material including the same elements is used for the first and second lower electrode layers 120 and 220, the resistance may vary depending on a relative content of the elements. For example, even when the same material TiN is used for the first and second lower electrode layers 120 and 220, the resistance of TiN may vary depending on the N content. The resistance of TiN may be the highest at about 10% of the content of N in TiN. Accordingly, the resistances of the first lower electrode layer 120 and the second lower electrode layer 220 may be different from each other by adjusting the N content in TiN. The N content of TiN may be adjusted in various manners. For example, in a sputtering process for forming the first and second lower electrode layers 120 and 220, $N_2$ gas ratio may be adjusted to make the N content in TiN of the first lower electrode layer 120 different from that in TiN of the second lower electrode layer 220.

Alternatively, as another example, even when the same material is used as the first and second lower electrode layers 120 and 220, the resistance may vary when a grain size is changed. In general, a resistance of a thin film increases as its grain size decreases and its grain boundaries increase. The grain size may be proportional to a deposition temperature of the thin film. Therefore, by adjusting the deposition temperature during a deposition process (e.g., a sputtering process) for forming the first lower electrode layer 120 and the second lower electrode layer 220, the grain sizes of the first lower electrode layer 120 and the second lower electrode layer 220 may be different from each other. As a result, the resistances of the first lower electrode layer 120 and the second lower electrode layer 220 may be different from each other.

Alternatively, as another example, an sp3/sp2 ratio may be varied while using carbon for the first and second lower electrode layers 120 and 220. A resistance of a carbon layer increases as its sp3/sp2 ratio increases. The sp3/sp2 ratio may be inversely proportional to a deposition temperature of the carbon layer. Therefore, by adjusting the deposition temperature during a deposition process (e.g., a sputtering process) for forming the first lower electrode layer 120 and the second lower electrode layer 220, the sp3/sp2 ratios of the first lower electrode layer 120 and the second lower electrode layer 220 may be different from each other. As a result, the resistances of the first lower electrode layer 120 and the second lower electrode layer 220 may be different from each other.

Next, the resistance may be changed by changing a width, or a size, or both of the first lower electrode layer 120 and the second lower electrode layer 220. This will be described in more detail with reference to FIG. 3 to be described later.

However, implementations of the present disclosure are not limited to the above-described methods, and any method may be used to adjust the resistances of the first lower electrode layer 120 and the second lower electrode layer 220.

The semiconductor memory according to the present implementation described above, although the first memory cell MC11 and the second memory cell MC21 share a common line (e.g., the second line 200 in FIG. 2B) so that currents in opposite directions flow through the first and second memory cells MC11 and MC21, respectively, and thereby the threshold voltages of the first selection element layer 130 and the second selection element layer 230 are different from each other. Thus, the threshold voltage of the first memory cell MC11 including the first selection element layer 130 may be different from that of the second memory cell MC21 including the second selection element layer 230. According to the present implementation, the difference between the threshold voltages of the first memory cell MC11 and the second memory cell MC21 may be reduced by adjusting one or more resistances of upper and lower electrodes of the first selection element layer 130 and upper and lower electrodes of the second selection element layer 230. As a result, operating characteristics of the first memory cell MC11 and the second memory cell MC21 may be similar, and a fabrication method of the semiconductor memory including the first and second memory cells MC11 and MC21 can be relatively simple by sharing the common line.

Figure 3:
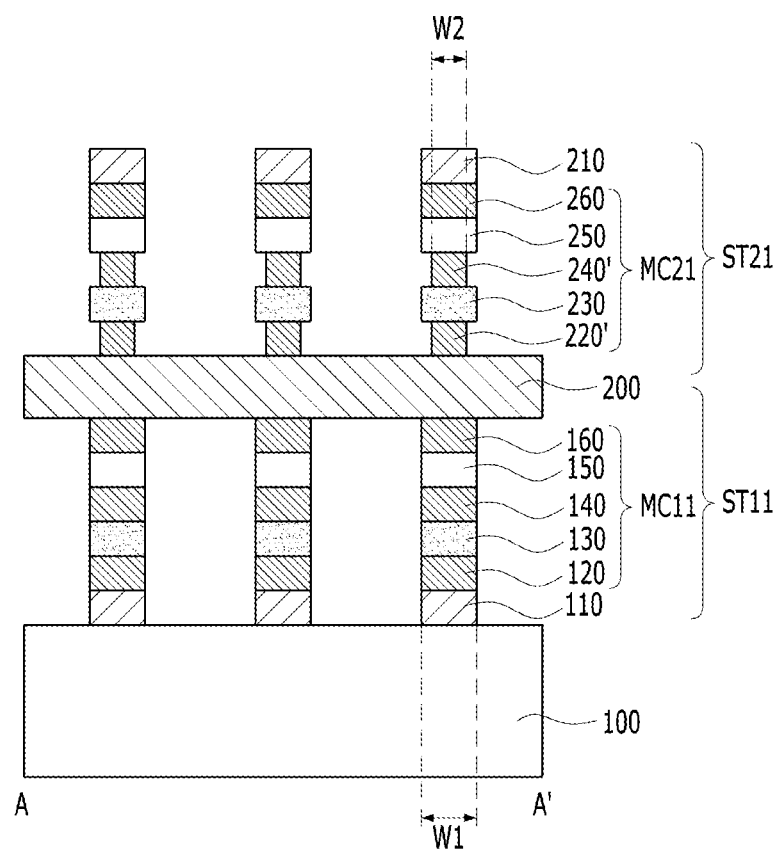
FIG. 3 is a cross-sectional view illustrating a semiconductor memory according to an implementation of the present disclosure.

FIG. 3 is a cross-sectional view illustrating a semiconductor memory according to an implementation of the present disclosure. Detailed descriptions of parts substantially the same as those of the implementation of FIGS. 2A and 2B will be omitted for the interest of brevity. For convenience of description, the case where the threshold voltage of the first selection element layer 130 is greater than the threshold voltage of the second selection element layer 230 will be described in this implementation.

Referring to FIG. 3, in the semiconductor memory according to the present implementation, a first memory cell MC11 may include a first lower electrode layer 120, a first selection element layer 130, a first middle electrode layer 140, a first memory layer 150, and a first upper electrode layer 160 which are sequentially stacked, and a second memory cell MC21 may include a second lower electrode layer 220', a second selection element layer 230, a second middle electrode layer 240', a second memory layer 250, and a second upper electrode layer 260 which are sequentially stacked.

Here, the second lower electrode layer 220' may be formed of the same material as the first lower electrode layer 120, and may have a width W2 smaller than a width W1 of the first lower electrode layer 120, thereby increasing the electrical resistance of the second lower electrode layer 220'. In this case, a contact resistance between the second lower electrode layer 220' and the second selection element layer 230 may increase as compared with a contact resistance between the first lower electrode layer 120 and the first selection element layer 130. As a result, the threshold voltage of the second memory cell MC21 may be increased by adding an offset voltage due to an increase in the contact resistance to the threshold voltage of the second selection element layer 230, so a difference between the threshold voltage of the second memory cell MC21 and the threshold voltage of the first memory cell MC11 may be reduced.

Similarly, the second middle electrode layer 240' may be formed of the same material as the first middle electrode layer 140, and may have a width W2 smaller than a width W1 of the first middle electrode layer 140, thereby increasing the electrical resistance of the second middle electrode layer 240'. In this case, a contact resistance between the second middle electrode layer 240' and the second selection element layer 230 may increase as compared with a contact resistance between the first middle electrode layer 140 and the first selection element layer 130. As a result, the threshold voltage of the second memory cell MC21 may be increased by adding an offset voltage due to an increase in the contact resistance to the threshold voltage of the second selection element layer 230, so a difference between the threshold voltage of the second memory cell MC21 and the threshold voltage of the first memory cell MC11 may be reduced.

In the present implementation of FIG. 3, the widths of the second lower electrode layer 220' and the second middle electrode layer 240' are both reduced, but one of the second lower electrode layer 220' and the second middle electrode layer 240' may be omitted, or only the width of one of the second lower electrode layer 220' and the second middle electrode layer 240' may be reduced.

Also, in the present implementation, the case where the threshold voltage of the first selection element layer 130 is greater than the threshold voltage of the second selection element layer 230 has been described. However, on the contrary, the threshold voltage of the second selection element layer 230 may be greater than the threshold voltage of the first select element layer 130. In this case, the width of the first lower electrode layer 120 may be smaller than that of the second lower electrode layer 220', or the width of the first middle electrode layer 140 may be smaller than that of the second middle electrode layer 240', or both.

In summary, a width of upper and/or lower electrodes of a selection element layer having a lower threshold voltage may be smaller than a width of upper and/or lower electrodes of another selection element layer having a larger threshold voltage.

Figure 4:
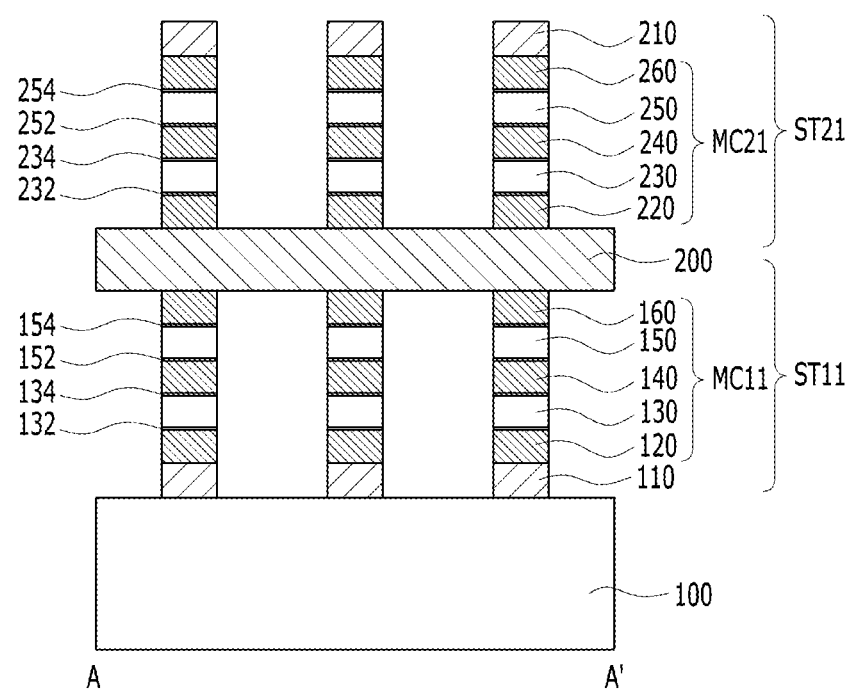
FIG. 4 is a cross-sectional view illustrating a semiconductor memory according to an implementation of the present disclosure.

FIG. 4 is a cross-sectional view illustrating a semiconductor memory according to an implementation of the present disclosure. Detailed descriptions of parts substantially the same as those of the implementation of FIGS. 2A and 2B will be omitted for the interest of brevity.

Referring to FIG. 4, in the semiconductor memory according to the present implementation, a first memory cell MC11 may further include first insert electrode layers 132, 134, 152, and 154, in addition to a first lower electrode layer 120, a first selection element layer 130, a first middle electrode layer 140, a first memory layer 150, and a first upper electrode layer 160. Similarly, a second memory cell MC21 may further include second insert electrode layers 232, 234, 252, and 254, in addition to a second lower electrode layer 220, a second selection element layer 230, a second middle electrode layer 240, a second memory layer 250, and a second upper electrode layer 260.

The first insert electrode layers 132, 134, 152, and 154 and the second insert electrode layers 232, 234, 252, and 254 may be formed to improve characteristics of the first memory cell MC11 and the second memory cell MC21. The first insert electrode layers 132, 134, 152, and 154 and the second insert electrode layers 232, 234, 252, and 254 may be thin layers which have a thickness smaller than that of the electrode layers 120, 140, 160, 220, 240, and 260.

In the present implementation, the first insert electrode layers 132, 134, 152, and 154 may be respectively disposed between the first lower electrode layer 120 and the first selection element layer 130, between the first selection element layer 130 and the first middle electrode layer 140, between the first middle electrode layer 140 and the first memory layer 150, and between the first memory layer 150 and the first upper electrode layer 160. However, embodiments of the present disclosure are not limited thereto, and one or more of the first insert electrode layers 132, 134, 152, and 154 may be omitted. The first insert electrode layer 132 may increase an adhesive force between the first selection element layer 130 and the first lower electrode layer 120 while reducing a contact resistance between the first selection element layer 130 and the first lower electrode layer 120. To this end, the first insert electrode layer 132 may be formed of a conductive material having a lower resistance than the first lower electrode layer 120 and having a better adhesive property. Similarly, the remaining first insert electrode layers 134, 152, and 154 each may be formed of a conductive material having a lower resistance and a better adhesive property than any one of the first lower electrode layer 120, the first middle electrode layer 140, and the first upper electrode layer 160.

Also, in the present implementation, the second insert electrode layers 232, 234, 252, and 254 may be respectively disposed between the second lower electrode layer 220 and the second selection element layer 230, between the second selection element layer 230 and the second middle electrode layer 240, between the second middle electrode layer 240 and the second memory layer 250, and between the second memory layer 250 and the second upper electrode layer 260. However, embodiments of the present disclosure are not limited thereto, and one or more of the second insert electrode layers 232, 234, 252, and 254 may be omitted. The second insert electrode layers 232, 234, 252, and 254 each may be formed of a conductive material having a lower resistance and a better adhesive property than any one of the second lower electrode layer 220, the second middle electrode layer 240, and the second upper electrode layer 260.

In particular, in the present implementation, with or without adjusting one or more resistances of the first lower electrode layer 120, the first middle electrode layer 140, the second lower electrode layer 220, and the second middle electrode layer 240, the resistances of the first insert electrode layers 132 and 134, which is located above and below the first selection element layer 130, and the second insert electrode layers 232 and 234, which is located above and below the second selection element layer 230, may be adjusted. Therefore, a difference between threshold voltages of the first memory cell MC11 and the second memory cell MC21 may be reduced.

Specifically, if the threshold voltage of the first selection element layer 130 is greater than the threshold voltage of the second selection element layer 230, resistances may be adjusted as described in the following cases.

In a first case, the resistance of the second insert electrode layer 232 below the second selection element layer 230 may be greater than the resistance of the first insert electrode layer 132 below the first selection element layer 130. In this case, since a resistance between the second selection element layer 230 and the second insert electrode layer 232 is increased, an additional offset voltage may be added to the relatively low threshold voltage of the second selection element layer 230 in the second memory cell MC21. As a result, the threshold voltage of the second memory cell MC21 may increase, and thus the difference between the threshold voltage of the second memory cell MC21 and the threshold voltage of the first memory cell MC11 may be decreased. Here, the first insert electrode layer 134 above the first selection element layer 130 and the second insert electrode layer 234 above the second selection element layer 240 may be omitted or may have substantially the same resistance.

Alternatively, in a second case, the resistance of the second insert electrode layer 234 above the second selection element layer 230 may be greater than the resistance of the first insert electrode layer 134 above the first selection element layer 130. Here, the first insert electrode layer 132 below the first selection element layer 130 and the second insert electrode layer 232 below the second selection element layer 230 may be omitted or may have substantially the same resistance.

Alternatively, in a third case, the resistances of the second insert electrode layers 232 and 234 below and above the second selection element layer 230 may be greater than those of the first insert electrode layers 132 and 134 below and above the first selection element layer 130.

In the first to third cases above, the resistance of the second lower electrode layer 220 may be greater than the resistance of the first lower electrode layer 120, the resistance of the second middle electrode layer 240 may be greater than the resistance of the first middle electrode layer 140, or both. Alternatively, the resistance of the second lower electrode layer 220 may be substantially the same as the resistance of the first lower electrode layer 120, and the resistance of the second middle electrode layer 240 may be substantially the same as the resistance of the first middle electrode layer 140.

Conversely, if the threshold voltage of the first selection element layer 130 is smaller than the threshold voltage of the second selection element layer 230, resistances may be adjusted as described in the following cases.

In a first case, the resistance of the second insert electrode layer 232 below the second selection element layer 230 may be smaller than the resistance of the first insert electrode layer 132 below the first selection element layer 130.

Alternatively, in a second case, the resistance of the second insert electrode layer 234 above the second selection element layer 230 may be smaller than the resistance of the first insert electrode layer 134 above the first selection element layer 130.

Alternatively, in a third case, the resistances of the second insert electrode layers 232 and 234 below and above the second selection element layer 230 may be smaller than those of the first insert electrode layers 132 and 134 below and above the first selection element layer 130.

In the first to third cases above, the resistance of the second lower electrode layer 220 may be smaller than the resistance of the first lower electrode layer 120, the resistance of the second middle electrode layer 240 may be smaller than the resistance of the first middle electrode layer 140, or both. Alternatively, the resistance of the second lower electrode layer 220 may be substantially the same as the resistance of the first lower electrode layer 120, and the resistance of the second middle electrode layer 240 may be substantially the same as the resistance of the first middle electrode layer 140.

The method of adjusting one or more resistances of the first insert electrode layers 132 and 134 and the second insert electrode layers 232 and 234 may be substantially the same as those described in the implementations of FIGS. 2A to 3. That is, types of materials used for the first insert electrode layers 132 and 134 and the second insert electrode layers 232 and 234, one or both of a concentration and a type of a doped material, a composition, a grain size, or the like may be adjusted, or widths of the first insert electrode layers 132 and 134 and the second insert electrode layers 232 and 234 may be adjusted.

Figure 5A:
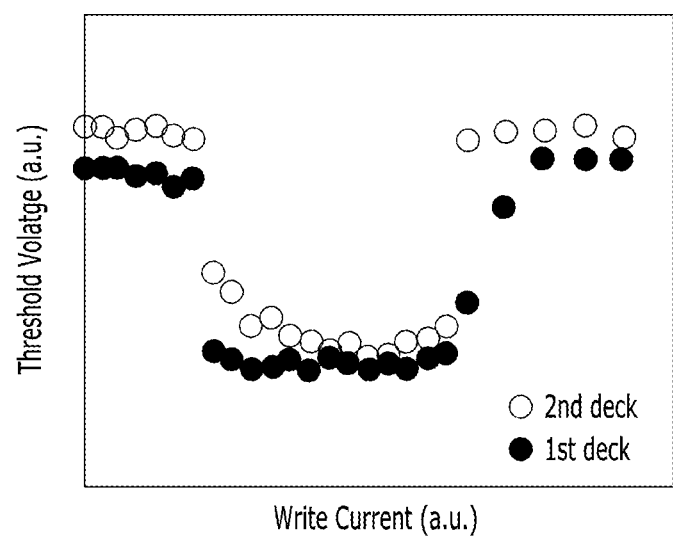
FIGS. 5A and 5B are graphs showing threshold voltage characteristics according to resistances of upper and lower electrodes of a selection element layer in a memory cell.
Figure 5B:
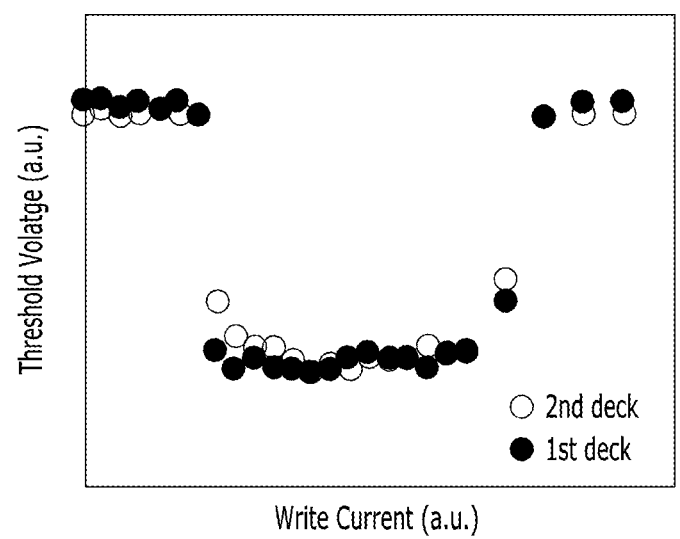

FIGS. 5A and 5B are graphs showing threshold voltage characteristics according to resistances of upper and lower electrodes of a selection element layer in a memory cell. FIG. 5A shows threshold voltages measured when resistances of upper and lower electrodes of a selection element layer are substantially equal to each other, and FIG. 5B shows threshold voltages measured when resistances of upper and lower electrodes of a selection element layer are different from each other. Specifically, in FIG. 5B, one or both resistances of upper and lower electrodes of a selection element layer having a smaller threshold voltage is increased compared to one or both resistances of upper and lower electrodes of another selection element layer having a greater threshold voltage.

Referring to FIG. 5A, a threshold voltage of a first memory cell in a lower stack structure, that is, a 1st deck is different from a threshold voltage of a second memory cell in an upper stack structure, that is, a 2nd deck.

On the other hand, referring to FIG. 5B, a difference between a threshold voltage of a first memory cell of a lower stack structure and a threshold voltage of a second memory cells of an upper stack structure is reduced, compared to the case of FIG. 5A.

The above and other memory circuits or semiconductor devices based on the disclosed technology can be used in a range of devices or systems. FIGS. 6-10 provide some examples of devices or systems that can implement the memory circuits disclosed herein.

Figure 6:
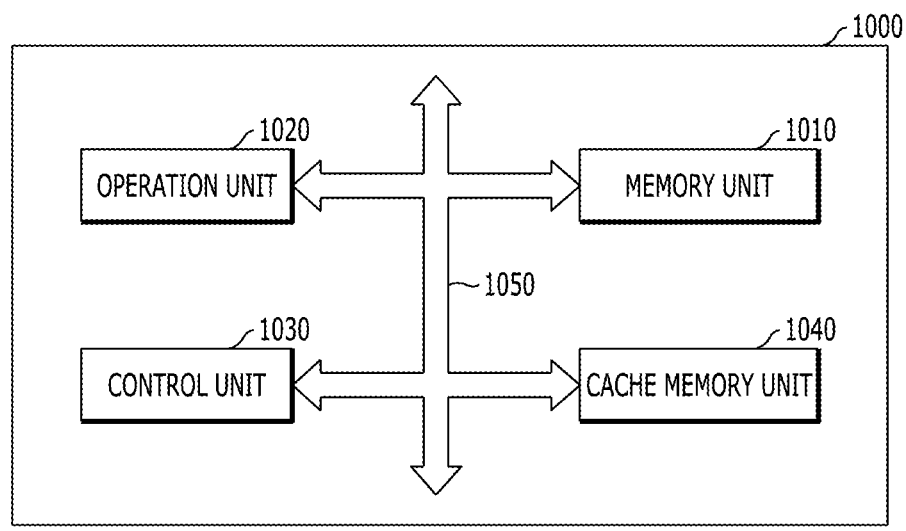
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first line; a second line spaced apart from the first line, the second line extending in a first direction that crosses the first line; a third line spaced apart from the second line, the third line extending in a second direction that crosses the second line; a first memory cell disposed between the first line and the second line at an intersection region of the first line and the second line, the first memory cell including a first selection element layer and a first electrode coupled to the first selection element layer; and a second memory cell disposed between the second line and the third line at an intersection region of the second line and third second line, the second memory cell including a second selection element layer and a second electrode coupled to the second selection element layer, wherein a threshold voltage of the first selection element layer is greater than a threshold voltage of the second selection element layer, and a resistance of the second electrode is greater than a resistance of the first electrode. Through this, operating characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
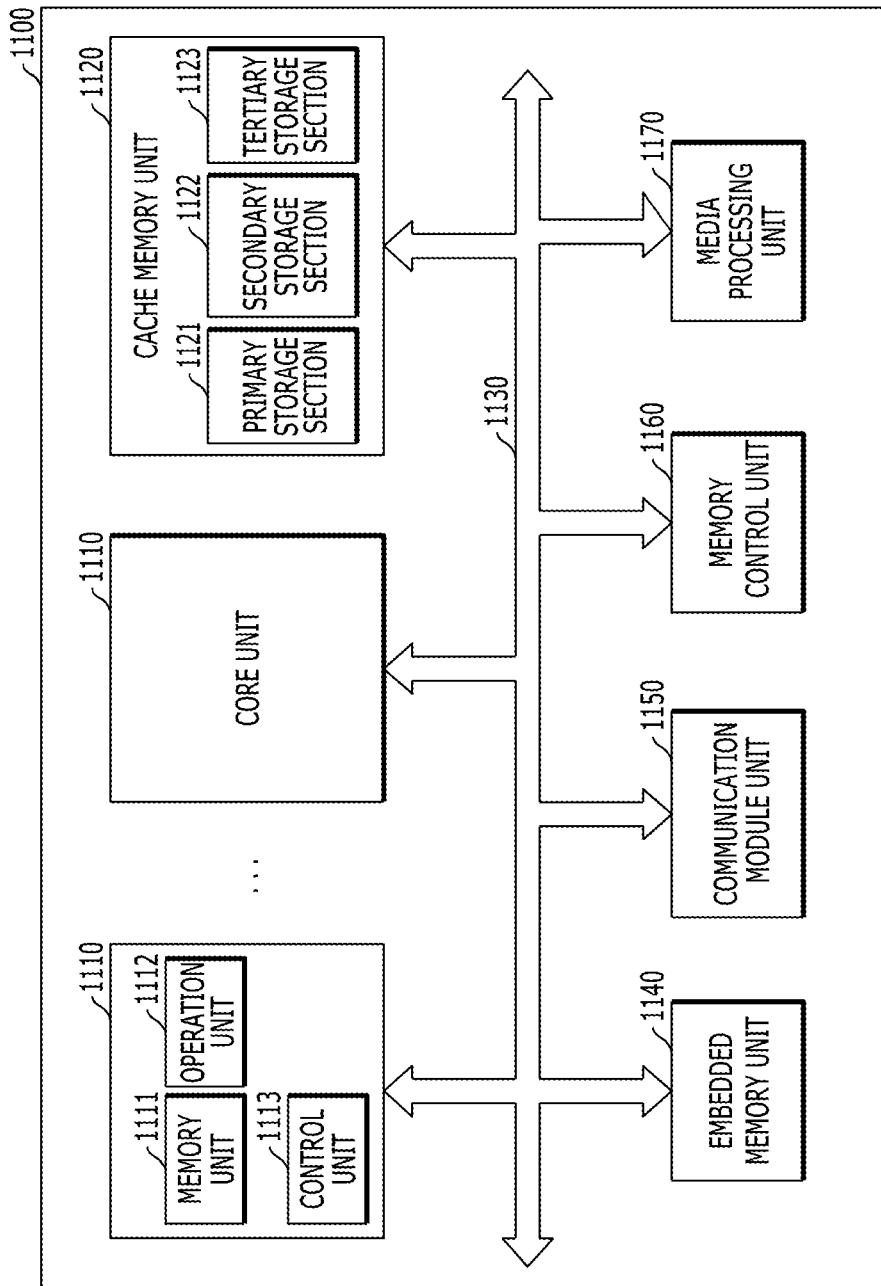
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first line; a second line spaced apart from the first line, the second line extending in a first direction that crosses the first line; a third line spaced apart from the second line, the third line extending in a second direction that crosses the second line; a first memory cell disposed between the first line and the second line at an intersection region of the first line and the second line, the first memory cell including a first selection element layer and a first electrode coupled to the first selection element layer; and a second memory cell disposed between the second line and the third line at an intersection region of the second line and third second line, the second memory cell including a second selection element layer and a second electrode coupled to the second selection element layer, wherein a threshold voltage of the first selection element layer is greater than a threshold voltage of the second selection element layer, and a resistance of the second electrode is greater than a resistance of the first electrode. Through this, operating characteristics of the cache memory unit 1120 may be improved. As a consequence, operating characteristics of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
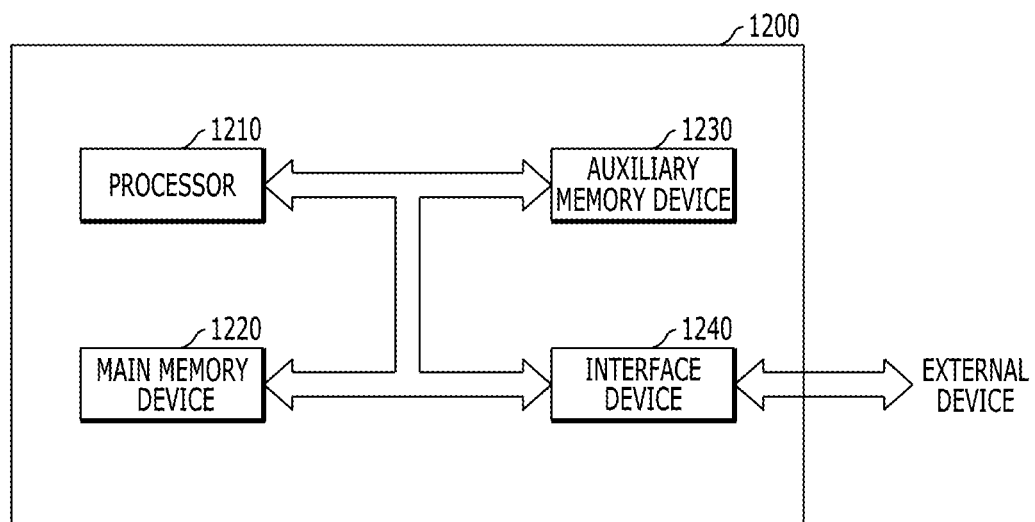
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first line; a second line spaced apart from the first line, the second line extending in a first direction that crosses the first line; a third line spaced apart from the second line, the third line extending in a second direction that crosses the second line; a first memory cell disposed between the first line and the second line at an intersection region of the first line and the second line, the first memory cell including a first selection element layer and a first electrode coupled to the first selection element layer; and a second memory cell disposed between the second line and the third line at an intersection region of the second line and third second line, the second memory cell including a second selection element layer and a second electrode coupled to the second selection element layer, wherein a threshold voltage of the first selection element layer is greater than a threshold voltage of the second selection element layer, and a resistance of the second electrode is greater than a resistance of the first electrode. Through this, operating characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a first line; a second line spaced apart from the first line, the second line extending in a first direction that crosses the first line; a third line spaced apart from the second line, the third line extending in a second direction that crosses the second line; a first memory cell disposed between the first line and the second line at an intersection region of the first line and the second line, the first memory cell including a first selection element layer and a first electrode coupled to the first selection element layer; and a second memory cell disposed between the second line and the third line at an intersection region of the second line and third second line, the second memory cell including a second selection element layer and a second electrode coupled to the second selection element layer, wherein a threshold voltage of the first selection element layer is greater than a threshold voltage of the second selection element layer, and a resistance of the second electrode is greater than a resistance of the first electrode. Through this, operating characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
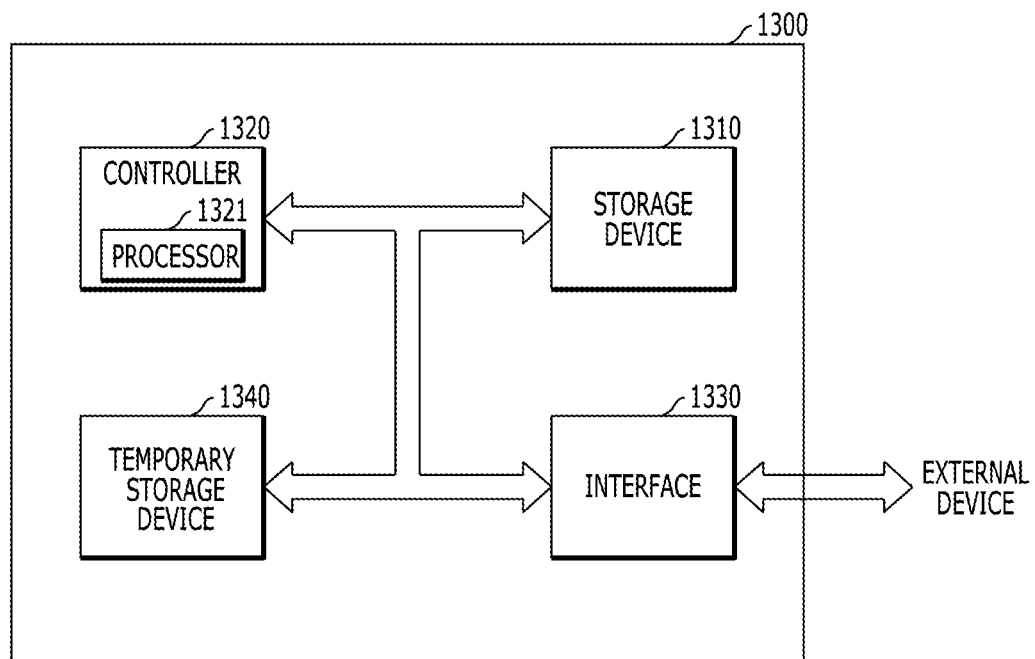
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first line; a second line spaced apart from the first line, the second line extending in a first direction that crosses the first line; a third line spaced apart from the second line, the third line extending in a second direction that crosses the second line; a first memory cell disposed between the first line and the second line at an intersection region of the first line and the second line, the first memory cell including a first selection element layer and a first electrode coupled to the first selection element layer; and a second memory cell disposed between the second line and the third line at an intersection region of the second line and third second line, the second memory cell including a second selection element layer and a second electrode coupled to the second selection element layer, wherein a threshold voltage of the first selection element layer is greater than a threshold voltage of the second selection element layer, and a resistance of the second electrode is greater than a resistance of the first electrode. Through this, operating characteristics of the temporary storage device 1340 may be improved. As a consequence, operating characteristics and data storage characteristics of the data storage system 1300 may be improved.

Figure 10:
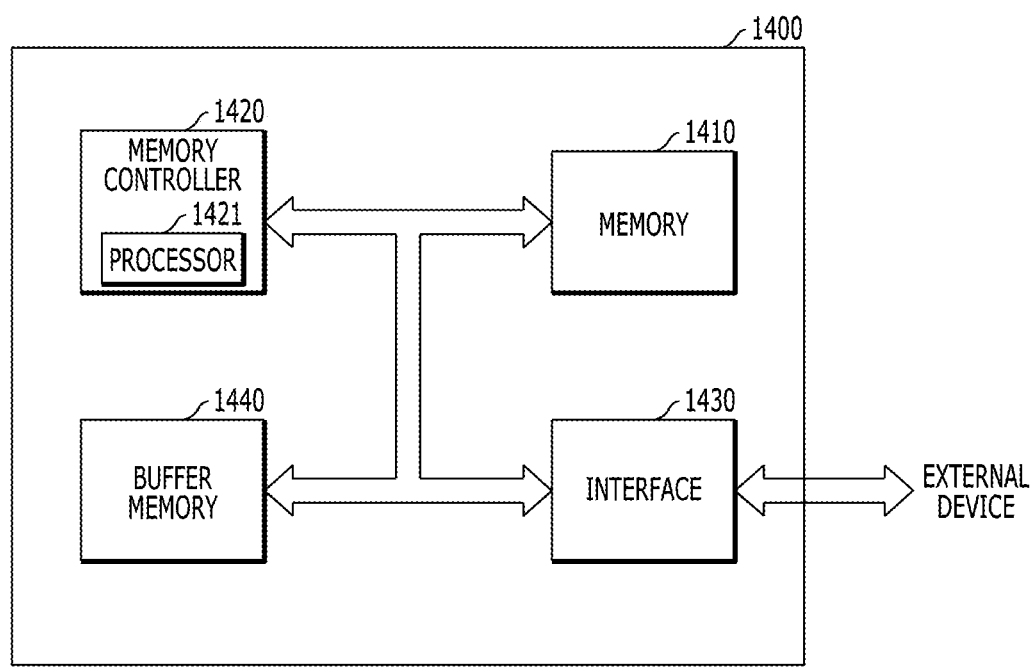
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first line; a second line spaced apart from the first line, the second line extending in a first direction that crosses the first line; a third line spaced apart from the second line, the third line extending in a second direction that crosses the second line; a first memory cell disposed between the first line and the second line at an intersection region of the first line and the second line, the first memory cell including a first selection element layer and a first electrode coupled to the first selection element layer; and a second memory cell disposed between the second line and the third line at an intersection region of the second line and third second line, the second memory cell including a second selection element layer and a second electrode coupled to the second selection element layer, wherein a threshold voltage of the first selection element layer is greater than a threshold voltage of the second selection element layer, and a resistance of the second electrode is greater than a resistance of the first electrode. Through this, operating characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first line; a second line spaced apart from the first line, the second line extending in a first direction that crosses the first line; a third line spaced apart from the second line, the third line extending in a second direction that crosses the second line; a first memory cell disposed between the first line and the second line at an intersection region of the first line and the second line, the first memory cell including a first selection element layer and a first electrode coupled to the first selection element layer; and a second memory cell disposed between the second line and the third line at an intersection region of the second line and third second line, the second memory cell including a second selection element layer and a second electrode coupled to the second selection element layer, wherein a threshold voltage of the first selection element layer is greater than a threshold voltage of the second selection element layer, and a resistance of the second electrode is greater than a resistance of the first electrode. Through this, operating characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
    a first line;
    a second line spaced apart from the first line and extending in a first direction that crosses the first line;
    a third line spaced apart from the second line and extending in a second direction that crosses the second line;
    a first memory cell disposed between the first line and the second line at an intersection region of the first line and the second line, the first memory cell including a first selection element layer, a first electrode coupled to the first selection element layer, and a first insert electrode interposed between the first selection element layer and the first electrode; and
    a second memory cell disposed between the second line and the third line at an intersection region of the second line and the third line, the second memory cell including a second selection element layer, a second electrode coupled to the second selection element layer, and a second insert electrode interposed between the second selection element layer and the second electrode,
    wherein a threshold voltage of the first selection element layer is greater than a threshold voltage of the second selection element layer, and a resistance of the second insert electrode is greater than a resistance of the first insert electrode.

2. The electronic device according to claim 1, wherein a resistance of the second electrode is greater than a resistance of the first electrode.

3. The electronic device according to claim 1, wherein, when a first current flows through the first memory cell from the first line to the second line, a second current flows through the second memory cell from the third line to the second line, and
    wherein, when a third current flows through the first memory cell from the second line to the first line, a fourth current flows through the second memory cell from the second line to the third line.

4. The electronic device according to claim 1, wherein the first insert electrode is a first side insert electrode which is in contact with a first surface of the first selection element layer, the first surface of the first selection element layer facing the first line, and wherein the second insert electrode is a second side insert electrode which is in contact with a first surface of the second selection element layer, the first surface of the second selection element layer facing the second line.

5. The electronic device according to claim 4, wherein the first memory cell further includes a third side insert electrode which is in contact with a second surface of the first selection element layer, the second surface of the first selection element layer facing the second line, wherein the second memory cell further includes a fourth side insert electrode which is in contact with a second surface of the second selection element layer, the second surface of the second selection element layer facing the third line, and wherein a resistance of the fourth side insert electrode is greater than a resistance of the third side insert electrode.

6. The electronic device according to claim 1, wherein the first insert electrode is a first side insert electrode which is in contact with a surface of the first selection element layer, the surface of the first selection element layer facing the second line, and wherein the second insert electrode is a second side insert electrode which is in contact with a surface of the second selection element layer, the surface of the second selection element layer facing the third line.

7. The electronic device according to claim 1, wherein the first insert electrode includes a first material different from a second material of the second insert electrode.

8. The electronic device according to claim 7, wherein each of the first insert electrode and the second insert electrode includes one or more materials selected from carbon, TiAlN, TiSiN, TaN, Ta, WN, TiN, Ti, W, Al, and Cu.

9. The electronic device according to claim 1, wherein the first insert electrode includes a first material and the second insert electrode includes a second material, the first material and the second material including a common element, a content of the element in the first material being different from a content of the element in the second material.

10. The electronic device according to claim 1, wherein the first insert electrode has a grain size that is greater than that of the second insert electrode.

11. The electronic device according to claim 1, wherein the first insert electrode and the second insert electrode include carbon, an sp3/sp2 of the second insert electrode being greater than that of the first insert electrode.

12. The electronic device according to claim 1, wherein a width of the second insert electrode is smaller than a width of the first insert electrode.

13. The electronic device according to claim 1, wherein a thickness of the first insert electrode is smaller than a thickness of the first electrode, and wherein a thickness of the second insert electrode is smaller than a thickness of the second electrode.

14. The electronic device according to claim 1, wherein a resistance of the first insert electrode is smaller than a resistance of the first electrode, and wherein a resistance of the second insert electrode is smaller than a resistance of the second electrode.

* * * * *